United States Patent [19]

Carickhoff

[11] 4,456,890
[45] Jun. 26, 1984

[54] DATA TRACKING CLOCK RECOVERY SYSTEM USING DIGITALLY CONTROLLED OSCILLATOR

[75] Inventor: Richard C. Carickhoff, Lansdale, Pa.

[73] Assignee: Computer Peripherals Inc., Minneapolis, Minn.

[21] Appl. No.: 365,698

[22] Filed: Apr. 5, 1982

[51] Int. Cl.³ .............................................. H03L 7/08
[52] U.S. Cl. .................................. 331/1 A; 331/10; 331/17; 331/23; 331/27; 375/120
[58] Field of Search ...................... 331/1 A, 10, 17, 23, 331/25, 27; 375/120

[56] References Cited

U.S. PATENT DOCUMENTS

| | | | |
|---|---|---|---|
| 4,017,803 | 4/1977 | Baker | 375/120 |
| 4,027,274 | 5/1977 | Fukui et al. | 332/19 |
| 4,166,979 | 9/1979 | Waggener | 375/120 |
| 4,215,430 | 7/1980 | Johnson | 375/120 |
| 4,259,740 | 3/1981 | Snell et al. | 375/120 |
| 4,280,099 | 7/1981 | Rattlingourd | 328/63 |

OTHER PUBLICATIONS

Gupta, "Phase-Locked Loops", Proceedings of the IEEE, vol. 63, No. 2, Feb. 1975, pp. 291-306.

Primary Examiner—Siegfried H. Grimm
Assistant Examiner—David C. Mis
Attorney, Agent, or Firm—Robert M. Angus; Joseph A. Genovese

[57] ABSTRACT

A clock recovery system including a VCO responsive to a voltage signal for generating a clock signal. A phase detector includes a register and a PROM, the register counting the clock signal to derive the output clock signal. The PROM is responsive to input data and the count in the register to detect and store information concerning relative phase relationships. A counter contains a count from which the control voltage for the VCO is derived. The PROM is operable to alter the count in the counter, thereby performing frequency adjustments, and to alter the count in the register to perform phase adjustments. Also, a converter, operable by the phase detector, may also derive a voltage signal for damping purposes.

7 Claims, 18 Drawing Figures

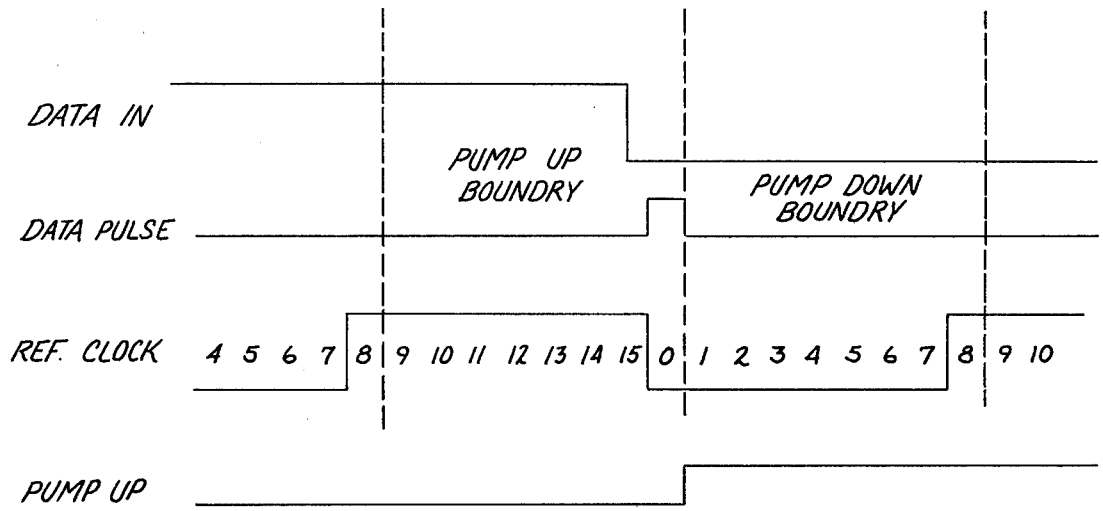
Fig.3A DATA LEADS REF. CLOCK
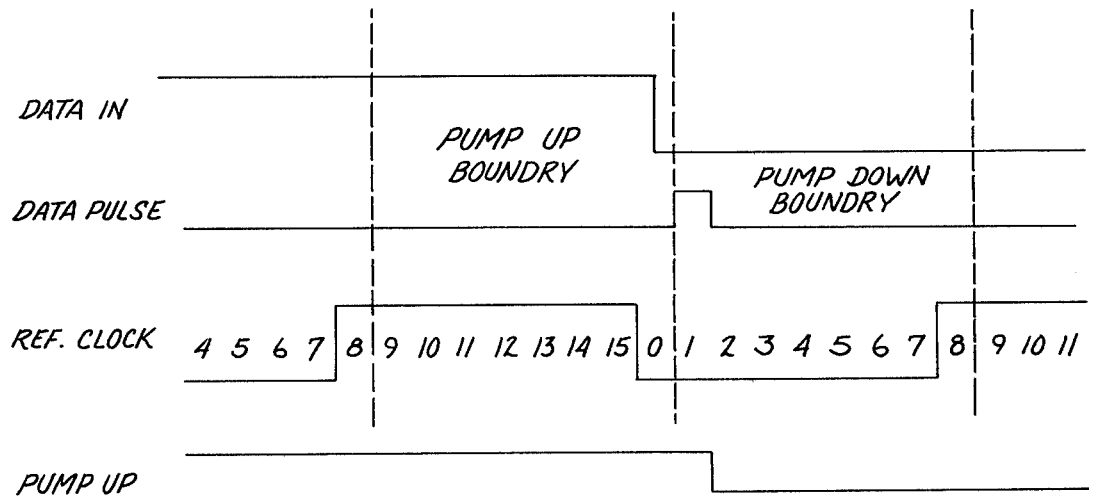
Fig.3B DATA LAGS REF. CLOCK

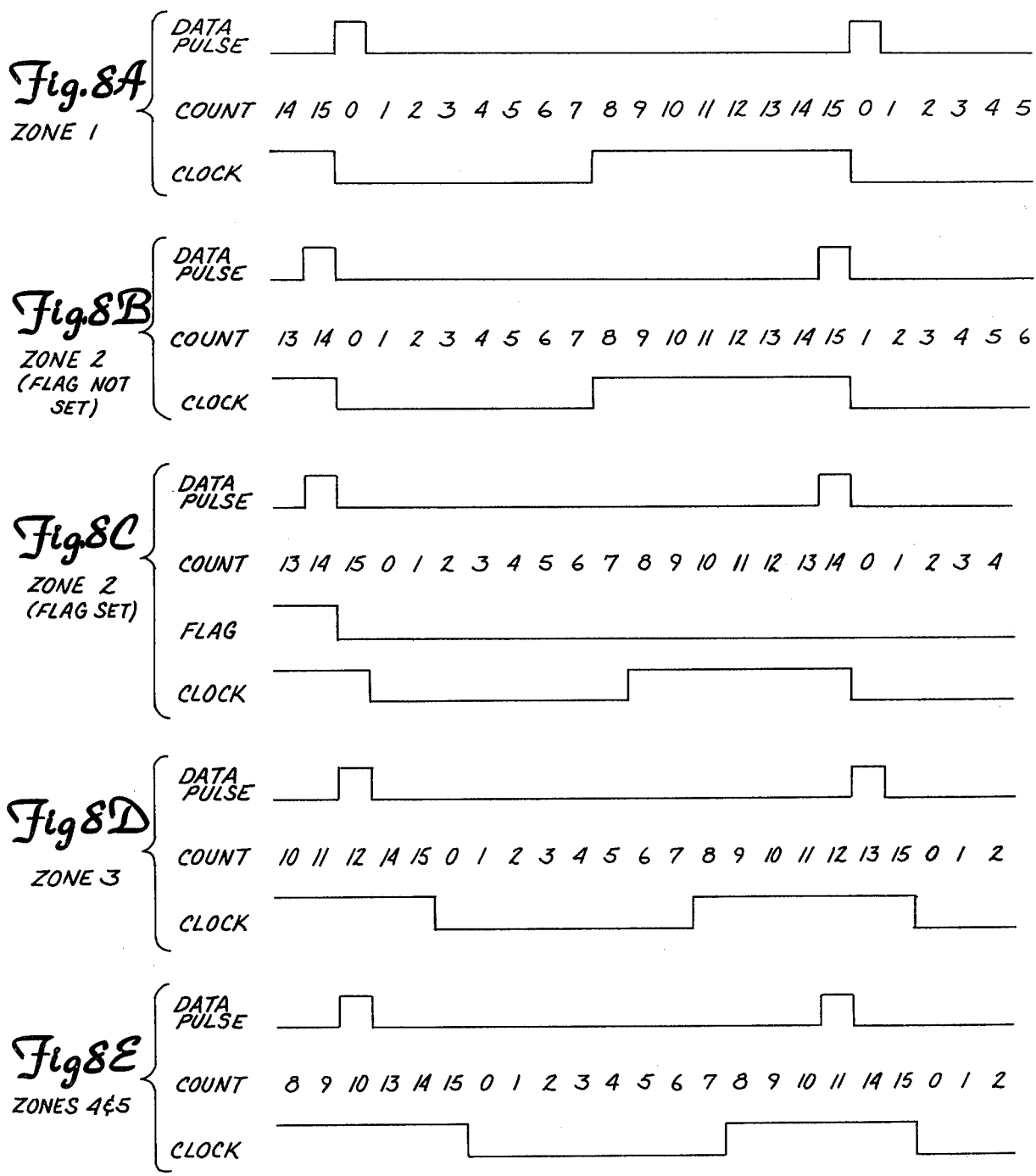

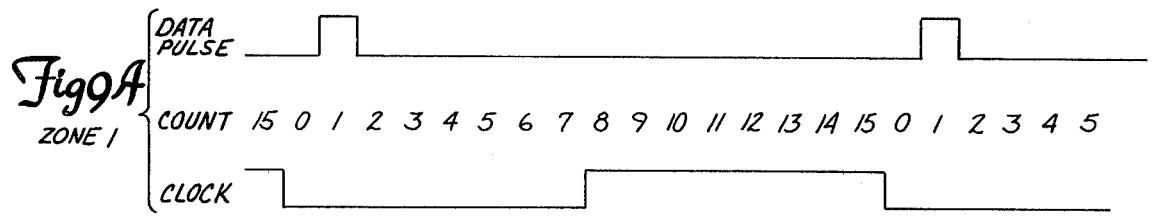
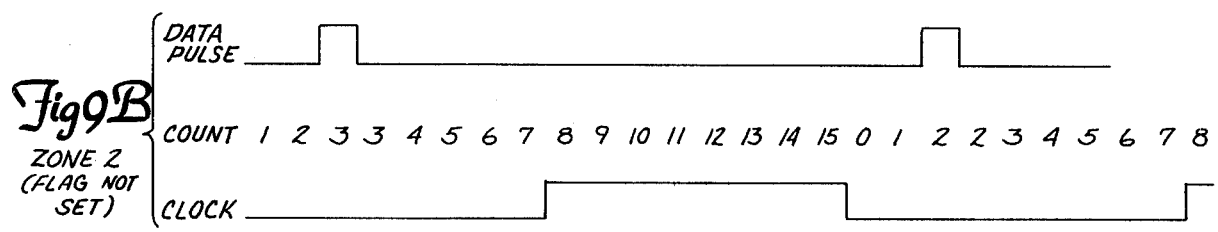
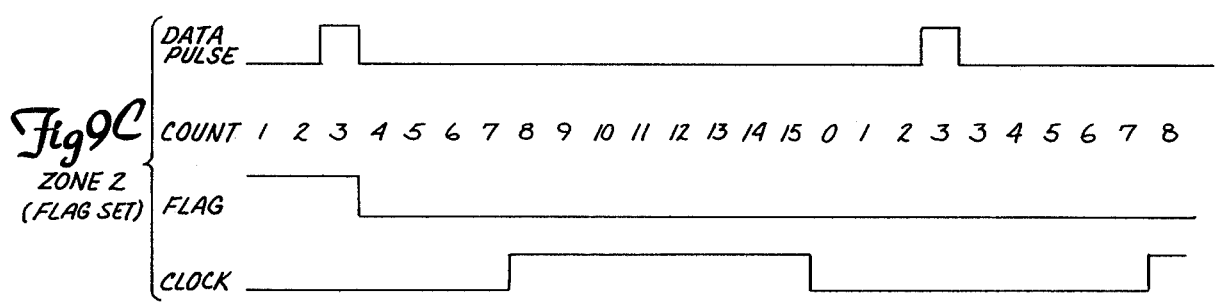
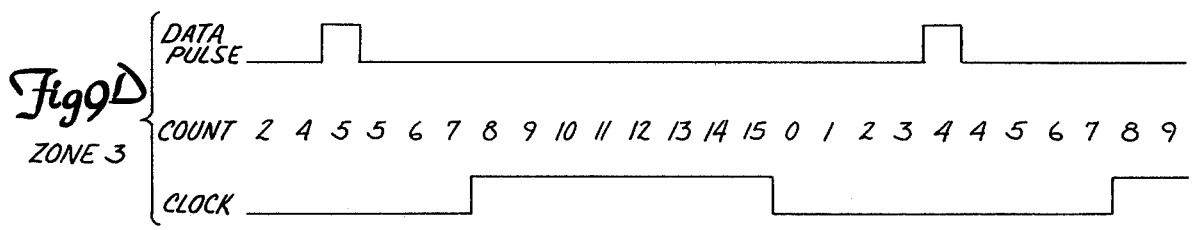
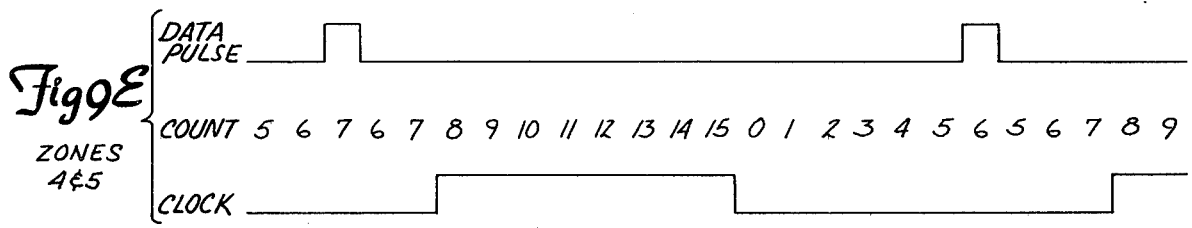

DATA TRACKING CLOCK RECOVERY SYSTEM USING DIGITALLY CONTROLLED OSCILLATOR

This invention relates to a clock recovery system, and particularly to a clock recovery system employing both digital and analog techniques.

Clock recovery systems are used in the data processing art to generate clock signals in synchronism with input data. Principal objectives of clock recovery systems are that they perform synchronism with a minimum of phase jitter, perform synchronism with a minimum lock range (as few clock cycles as possible), and be stable against drift and temperature changes.

Prior clock recovery systems employing analog techniques have been subject to instability due to temperature variations and due to problems associated with filters used for multiple data rate frequencies. The present invention employs both digital and analog techniques for clock recovery, thereby offering a stable, multi-range system.

Therefore, one object of the present invention is to provide a clock recovery system which is relatively stable against drift and temperature changes, does not require filters, and which achieves synchronization with minimum phase jitter, improved lock range, and a minimum access time.

Another object of the present invention is to provide a clock recovery system which does not require high frequency oscillators to obtain frequency synchronization, as are used in digital systems.

Still another object of the present invention is to provide a clock recovery system which can capture and track data frequencies over a wide frequency spectrum and which is capable of differentiating between frequency variation and asymmetry on the input data. In accordance with the present invention, a VCO (voltage controlled oscillator) is responsive to a control voltage to provide a clock signal. A phase detector includes a programmable read-only memory (PROM) and a register, the register including a count section to effectively divide the VCO clock signal to derive the output clock signal. The PROM is responsive to input data and to the count in the register to detect phase relationship. If a frequency correction is required, the PROM steps the count in a counter, from which the control voltage for the VCO is derived. A converter is responsive to the phase detector to provide an additional signal, added to the control voltage, to provide damping of the signal for phase correction purposes.

One feature of the present invention resides in the ability of the system to handle peak shift problems often associated with data recorded on magnetic tape. In accordance with this feature, the PROM can also alter the count in the register, thereby effecting a phase shift separate from frequency corrections.

The above and other features of this invention will be more fully understood from the following detailed description, and the accompanying drawings, in which:

FIGS. 3A, 3B and 4 are timing diagrams useful in explaining the operation of the system;

FIGS. 8A–E and 9A–9E are timing diagrams useful in explaining operation of the present invention for peak shift problems.

Figure 1:
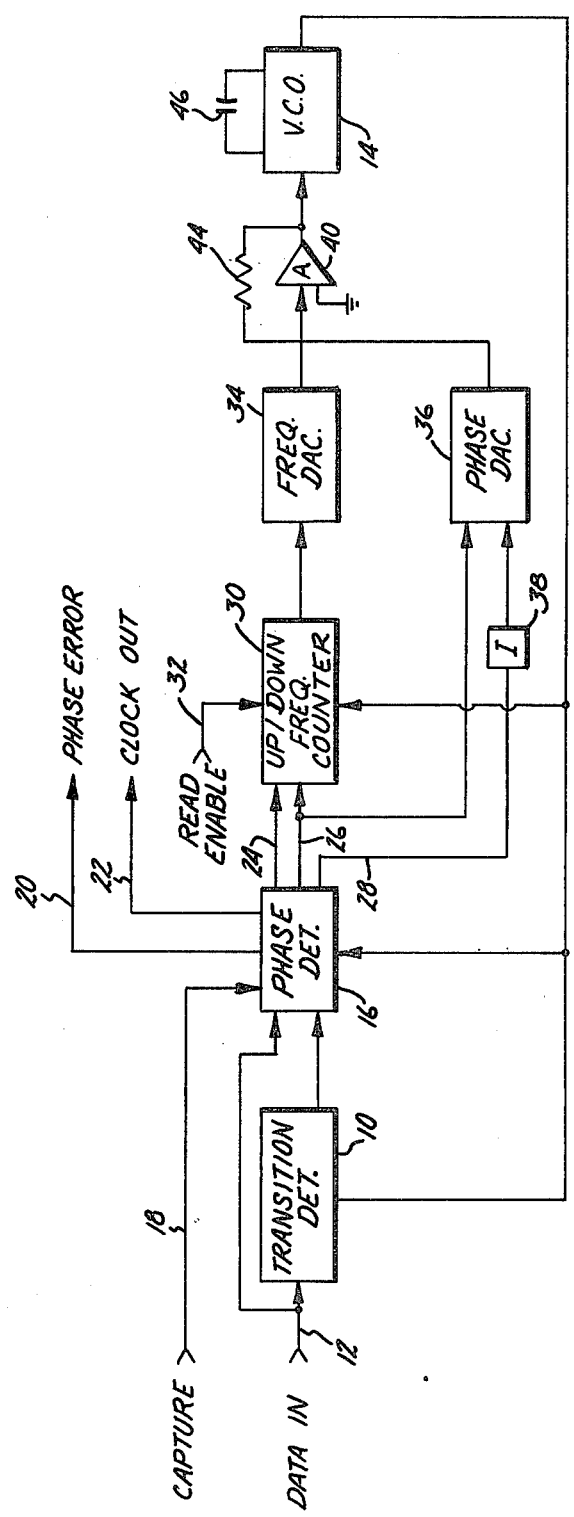
FIG. 1 is a block circuit diagram of the clock recovery system in accordance with the presently preferred embodiment of the present invention.

Referring to the drawings, particularly to FIG. 1, there is illustrated a block circuit diagram of a clock recovery system in accordance with the presently preferred embodiment of the present invention. The recovery system includes a transition detector 10 having a first input for receiving input data via lead 12, and a second input to receive clock signals from voltage controlled oscillator (VCO) 14. Transition detector 10 provides an output to phase detector 16. Phase detector 16 also receives input data from lead 12, and also receives inputs from VCO 14 and a capture signal via lead 18. Phase detector 16 provides a phase error output via lead 20, a clock output via lead 22, a step count output via lead 24, a pump up signal via lead 26 and a pump enable signal via lead 28. An up/down frequency counter 30 receives step counter and pump up signals from phase detector 16 as well as the clock output from VCO 14. Counter 30 also receives a read enable signal via lead 32. A digital-to-analog converter (DAC) 34 receives the output of counter 30 whereas digital-to-analog converter (DAC) 36 receives the pump up and pump enable signals from phase detector 16. DAC 34 is employed for frequency correction and control, and DAC 36 is employed for phase correction and control. The pump enable signal is inverted by inverter 38 prior to input to DAC 36. The output of DACs 34 and 36 are provided as an input to amplifier 40 which provides a voltage signal to VCO 14. The function of amplifier 40 is to convert the current derived by DACs 34 and 36 to a voltage signal for delivery to the VCO. The gain of amplifier 40 may be adjusted by resistor 44, and the nominal frequency of VCO 14 may be controlled by capacitor 46.

Figure 2:
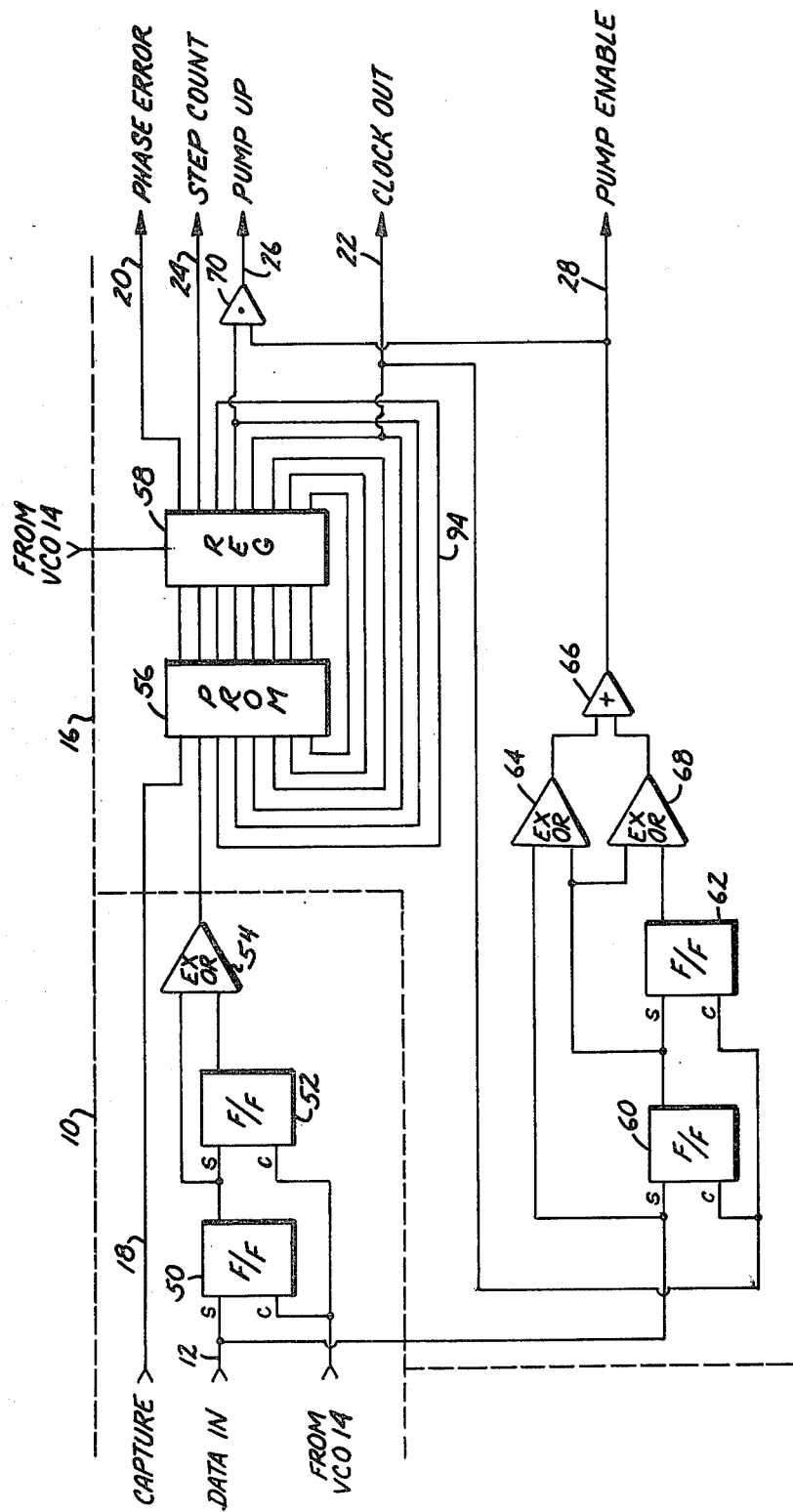
FIG. 2 is a block circuit diagram of a portion of the apparatus illustrated in FIG. 1.

FIG. 2 illustrates a more detailed embodiment of transition detector 10 and phase detector 16. As shown in FIG. 2, transition detector 10 comprises a pair of flip-flops 50 and 52, the set side of flip-flop 50 being connected to lead 12 to receive input data and the set input of flip-flop 52 being connected to the set output of flip-flop 50. The clock inputs of flip-flops 50 and 52 are connected to VCO 14. EXCLUSIVE OR gate 54 receives inputs from the set outputs of flip-flops 50 and 52 and provides a data pulse input to programmable read only memory (PROM) 56 of phase detector 16. The phase detector preferably comprises a 256 by 8 bit PROM 56 and a register 58 clocked by VCO 14. PROM 56 and register 58 operating together generate a divide by 16 count. The most significant bit of the divide by 16 portion of register 58 (the fourth lead thereof) provides the clock out signal via lead 22. The fifth output lead of register 58 provides a pump up signal, the seventh lead of register 58 provides a step count signal via lead 24, and the eighth or most significant output of register 58 provides a phase error signal via lead 20. The clock out signal from the fourth position of register 58 also provides an input to the clock inputs of flip-flops 60 and 62. The set input of flip-flop 60 is connected to lead 12 to receive input data and the set input of flip-flop 62 is connected to the set output of flip-flop 60. EXCLUSIVE OR gate 64 receives inputs from lead 12 and the set output of flip-flop 60 and provides a first input to OR gate 66. The second input to OR gate 66 is provided from the output of EXCLUSIVE OR gate 68 whose inputs are connected to receive the set outputs of both flip-flops 60 and 62. The output of OR gate 66 is provided via lead 28 to converter 36 and to AND gate 70 to provide pump up signals via lead 26 to both frequency counter 30 and converter 36.

In the data recording art, the term "data rate" is applied to the rate upon which data is transmitted. Data, which flows at a pre-established data rate, is reflected by transitions in an incoming signal. For example, a typical group code recording technique will employ a transition in the signal for each data cell containing a "1" bit and no transition for each data cell containing "0" bit, with the condition that there will be no more than two cells containing "0" bits in a row. Therefore, in such a group code recording technique, transitions will occur either at the data rate (consecutive "1" bits) or at half the data rate (a "1" bit followed by a "0" bit followed by a "1" bit), or at one-third the data rate (a "1" bit followed by two "0" bits followed by a "1" bit).

With the foregoing in mind, the operation of the clock recovery system in accordance with the present invention may be explained. VCO 14 provides a clock signal whose cycle rate is 16 times the data rate. The clock signal is provided to transition detector 10 to provide a data pulse coincident with a clock signal from oscillator 14 immediately following (or coincident with) a data transition. As shown in FIG. 3, the data transition might lead the reference clock signal on lead 22 (FIG. 3A), or it might lag the reference clock (FIG. 3B). Phase detector 16 detects the phase of the data transitions in respect to the reference clock and operates DACs 34 and 36 to adjust the frequency and phase of VCO 14. Phase correction is accomplished by DAC 36 independently of a frequency correction, whereas frequency correction is accomplished by incrementing or decrementing the count of frequency counter 30 which controls DAC 34 to establish the frequency of oscillator 14. Broadly, therefore, phase detector 16 examines the relative position of the data pulse with reference to the output clock and makes a decision as to whether or not to step frequency counter 30. As will be seen hereafter, adjustment of frequency may require adjustment of phase, and vice versa.

Register 58 of phase detector 16 is continuously stepped by the clock signal from oscillator 14 (which is operating at 16 times the rate of the reference clock output). If transition detector 10 detects a data transition, and if the data transition is out of phase with the reference clock, a signal representative of either a pump up or pump down condition is stored in PROM 56 and register 58. Depending upon how far removed the transition signal occurs from the phase of the reference clock, PROM 56 may be programmed to provide a multiple step change in counter 30 (to be hereafter explained). PROM 56 and register 58 compare the relative phase of the current data cell transition with respect to the phase of the reference clock 22 to provide a pump up or pump down signal to counter 30 and converter 36 depending upon whether the transition leads or lags the reference clock.

Phase detector 16 determines the relative position of a data transition with respect to the clock pulse and compares that position with the position of the data transition of the previous data cell. If the position (phase shift) of the transition of the current cell is opposite that of the previous cell, phase detector 16 does not initiate a change in counter 30. However, if the positions of the data transition in both cells are relatively the same, then the phase detector will step the frequency counter. In either case, the pump up signal delivered to both frequency counter 30 and converter 36 will reflect the direction of the transition removal. Thus, update of the frequency counter is delayed one cell to provide single cell hysteresis and improve the accuracy of the reference clock frequency.

With reference to FIGS. 3A and 3B, the pump up and pump down aspects of the phase detector 16 may be explained. A data pulse occurring during counts 9 through 15 and 0 of the clock from oscillator 14 is treated by the phase detector as a pump up condition, whereas a data pulse occurring during counts 1 through 8 is treated as a pump down condition. Therefore, in FIG. 3A, the data transition leads the reference clock causing the data pulse from transition detector 10 to occur in the pump up boundary condition. In FIG. 3B the data lags the clock causing the data pulse to occur in the pump down boundary thereby causing a pump down condition. Successive data pulses occurring in opposite boundaries will require no frequency change whereas successive data pulses occurring in the same boundary requires a frequency change. As explained above, phase detector 16 detects the need for a frequency change and operates counter 30 accordingly.

Figure 4:
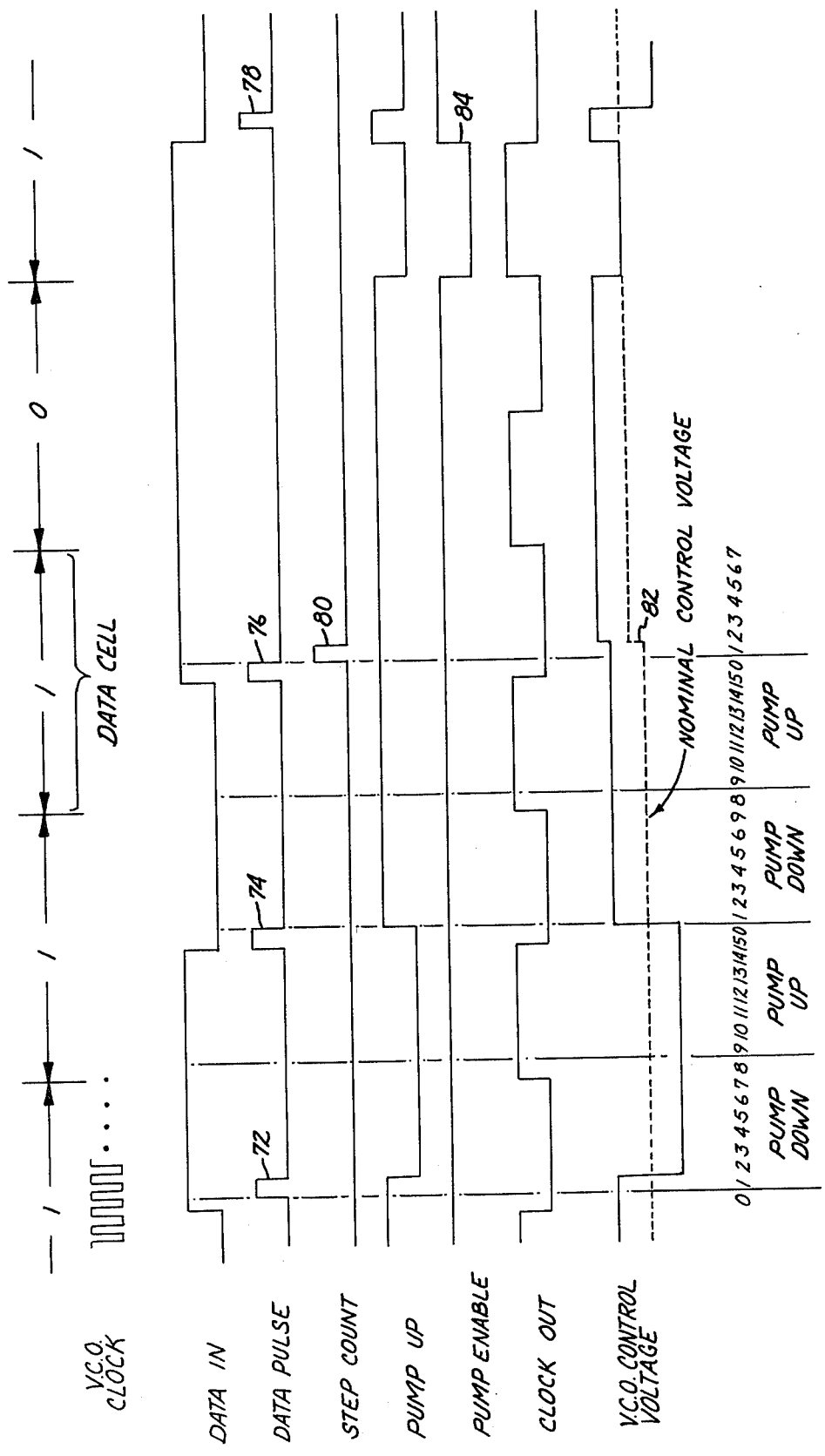

With reference to FIG. 4, the frequency correction aspects of the present invention may be explained. As heretofore explained, input data pulses will occur in either the pump up or pump down boundary. Thus, in FIG. 4 data pulses 72 and 78 are in the pump down boundary, whereas pulses 74 and 76 are in the pump up boundary. PROM 56 and register 58 sense the position of the data pulses and produce a pump up signal, essentially as shown in FIG. 4. (As will be explained hereafter, the pump up signal developed by PROM 56 and register 58 is logically anded with the pump enable signal used for phase control. Thus, FIG. 4 actually illustrates the pump up signal after logically anding. The pump up signal developed by PROM 56 and register 58 actually follows the boundary condition of the data pulses.) Since pulses 74 and 76 are consecutively in the pump up region, PROM 56 and register 58 sense the fact that the phase shift of both pulses is in the same direction and initiate a step count signal, shown as pulse 80. The pump up signal and step count signal are delivered to up/down frequency counter 30.

Frequency counter 30 is preferably a 7-bit counter having its most significant bit preset to "1" and all other bits set to "0". This will provide a frequency accuracy of 0.5% over a frequency range of ±32%. The frequency counter is initialized by the read enable signal to preset the counter to the established position.

Counter 30 senses the pump up signal and step count signal from phase detector 16 and increments or decrements the count in the counter by the number of step count pulses in the step count signal and in the direction dictated by the condition of the pump up signal. In the example shown in FIG. 4, when the pump up signal is high, the count in counter 30 is advanced. (If the consecutive data pulses were in the pump down boundary, the pump up signal would be low when the step count signal is generated, thereby causing a decrement in the count in counter 30.) During each clock cycle of VCO 14, the count of counter 30 is presented to converter 34 as a digital count of the frequency. Therefore, a change in count stored in counter 30 causes a corresponding change in the digital signal. When the count in counter 30 is advanced by one count, the digital signal to converter 34 is also advanced, thereby causing an increase in the control voltage to VCO 14, as shown at reference number 82.

Figure 5:
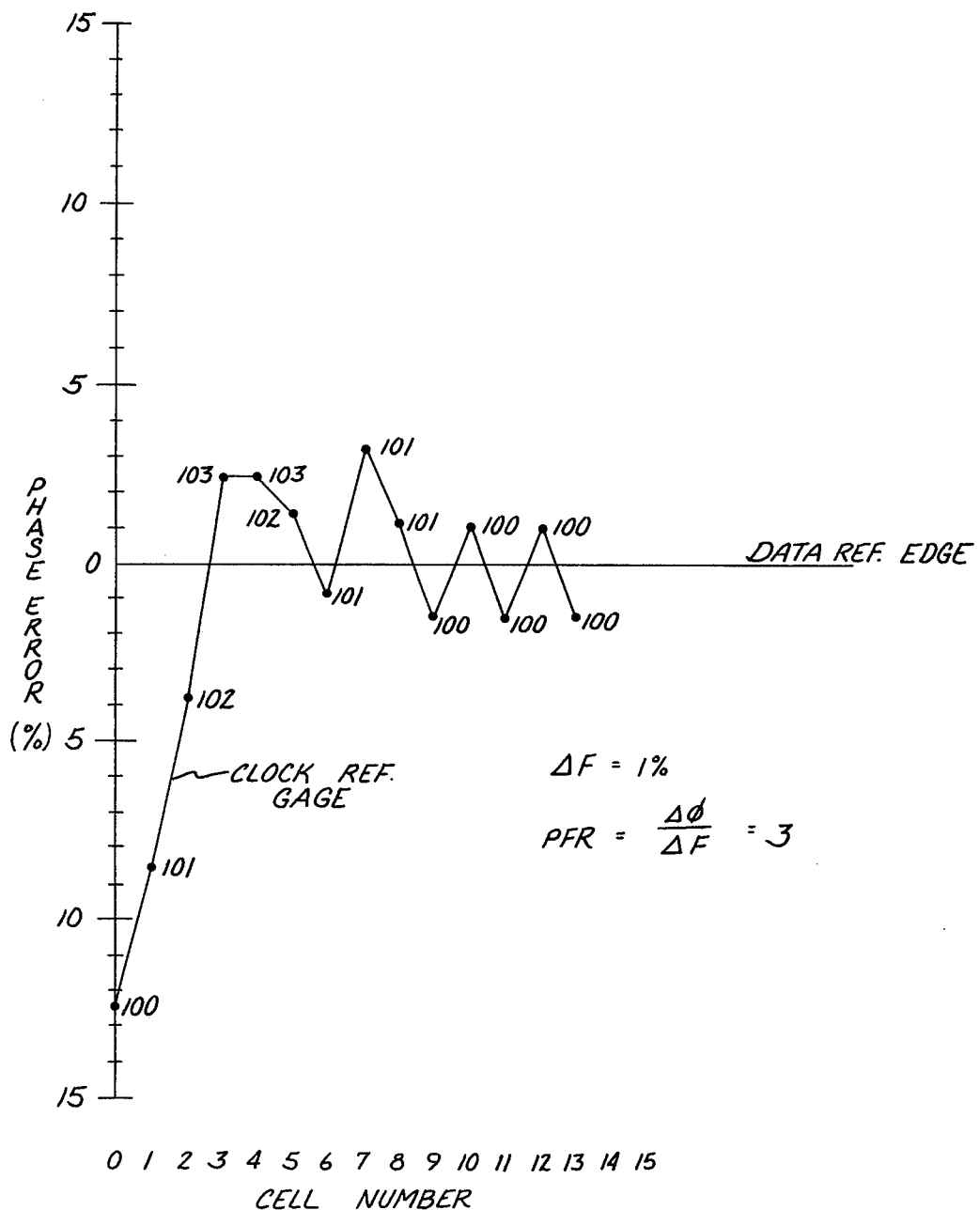
FIG. 5 is a waveform illustrating the results achievable with the present invention.

Without phase correction, the system would operate such as to deliver a control voltage shown in the dashed line in FIG. 4. However, the phase converter 36 is provided as a damping factor to stabilize the system, and the phase component or correction is added to the frequency correction to control VCO 14. Experimentation indicates that a phase to frequency correction ratio (PFR) between 2 and 3 is optimum, with best results achieved with PFR=2.5. It can be shown that for PFR ratios of less than about 2 (PFR=2) the system will be somewhat underdamped, whereas for PFR ratios greater than about 4 (PFR=4) the system will be somewhat overdamped. FIG. 5 illustrates the effect of damping, using a PFR ratio of 3.0. As indicated in FIG. 5, with PFR=3 and a frequency of 100, a phase shift of 12.5% is corrected within about 10 cells. For a frequency increment of 0.5%, the phase correction should be ±1.25% with a PFR=2.5.

As shown in FIG. 4, the pump up signal generated by register 58 essentially follows the condition of the data pulses. Therefore, with pulse 72 in the pump down boundary, the pump up signal goes low; with pulse 74 and 76 in the pump up boundary, the pump up signal goes and remains high; with pulse 78 in the pump down boundary, the pump up signal goes low. However, the pump up signal delivered to counter 30 and converter 36 is logically anded with the pump enable signal by AND gate 70. The pump enable signal is generated by gates 64, 66 and 68 and flip-flops 60 and 62, the arrangement being that the pump enable signal is high at all times except that it is triggered low by the reference clock signal following a "0" bit cell. Hence, the pump enable signal goes low as shown at reference numeral 84, thereby driving the pump up signal to a low condition. The pump up signal goes high upon return of the high condition of the pump enable signal and goes low with data pulse 78 in the pump down boundary. (If pulse 78 were in the pump up boundary, the pump up signal would remain high and another step count signal would be generated to again advance the count in counter 30.)

DAC 36 is essentially a ternary device; that is, it may assume any of three states: (1) a positive current output, (2) a zero output or (3) a negative current output. If the pump enable signal is high, the output of DAC 36 will be either positive or negative, depending upon whether the pump up signal is high or low. However, if the pump enable signal is low, the output of DAC 36 is zero, regardless of the state of the pump up signal. Since the pump enable signal is low during drift conditions of no data transitions (data values of "0"), DAC 36 is disabled, in essence, by the low pump enable signal to permit the clock recovery system to coast until data transitions resume.

As shown in FIG. 4, the actual control voltage to VCO 14 assumes any of three values: the nominal voltage established by DAC 34 (i.e., when the pump enable signal is low), an upper voltage caused by the nominal voltage plus that added to it by a pump up condition sensed by DAC 36, and a lower voltage caused by the nominal voltage less that subtracted from it by a pump down condition sensed by DAC 36. It will be appreciated that the phase of the reference clock is altered with the frequency of the VCO by increasing or decreasing the VCO frequency for one cell. Further, when the frequency is locked to the data, the phase control alternately and essentially equally advances and retards about the synchronized phase.

One feature of the present invention resides in the accelerated synchronization of the reference clock, or clock out signal, to the incoming data rate. This is accomplished by setting the capture signal on lead 18 and by phase detector 16, and particularly PROM 56 and register 58, sensing the data more than 6.25% out of synchronism with the clock. As heretofore explained, the lower four outputs of register 58 act as a counter, counting up to 16 counts for each reference clock cycle, the count output of register 58 cooperating with PROM 56 to establish the reference count and the pump up and pump down boundaries illustrated in FIGS. 3 and 4. Thus, if as illustrated in FIG. 3A, the data leads the reference clock, the data pulse generated by transition detector 10 causes PROM 56 and register 58 to generate a pump up signal, whereas if the data lags the reference clock, a pump down signal is generated (FIG. 3B). The conditions illustrated in FIGS. 3 and 4 are conditions where the data is less than 6.25% out of synchronism with the reference clock; namely, when the data pulse occurs in either the "0" (pump up) or "1" (pump down) reference count.

Figure 6:
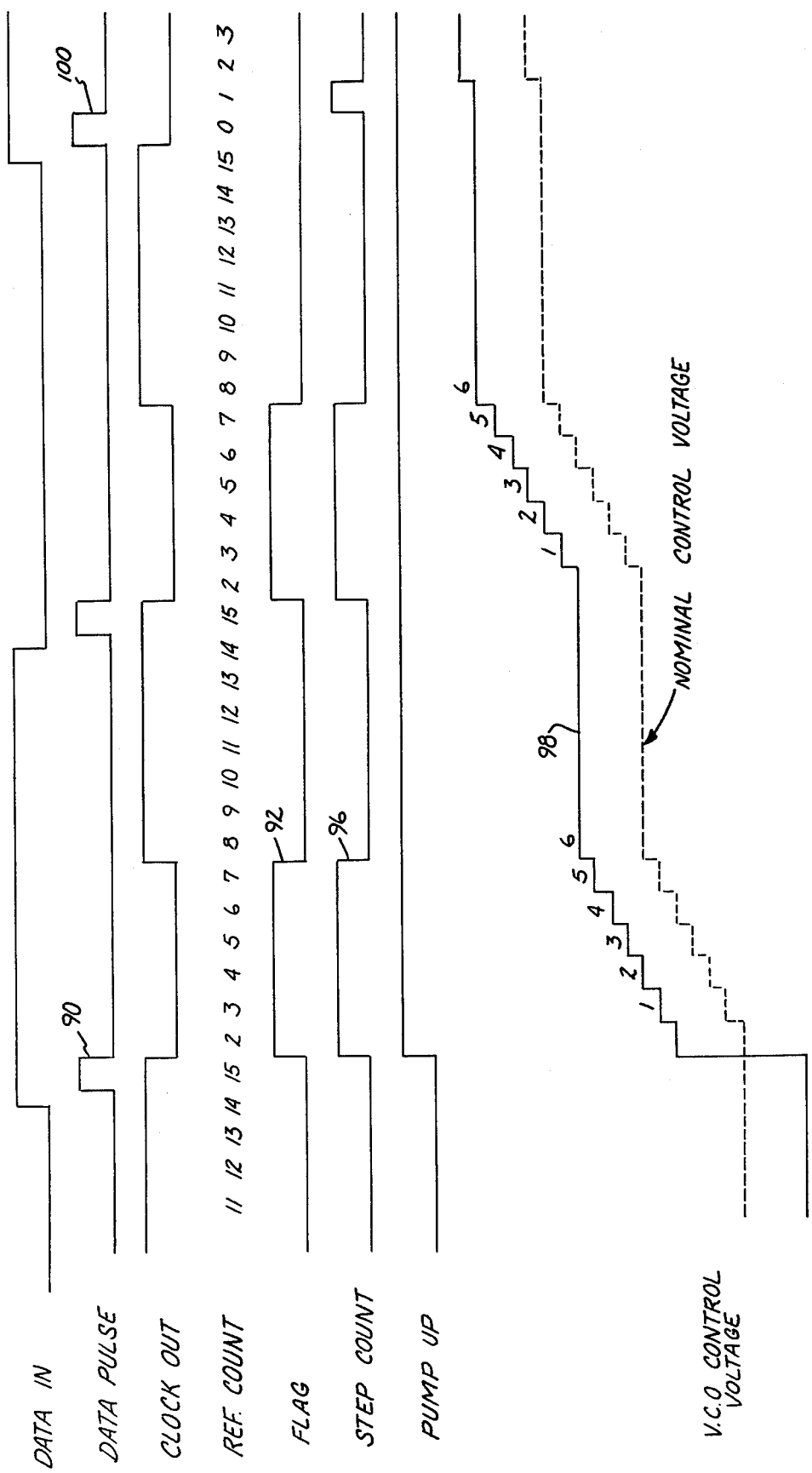
FIGS. 6 and 7 are timing diagrams useful in explaining the accelerated mode of operation of the present invention.
Figure 7:
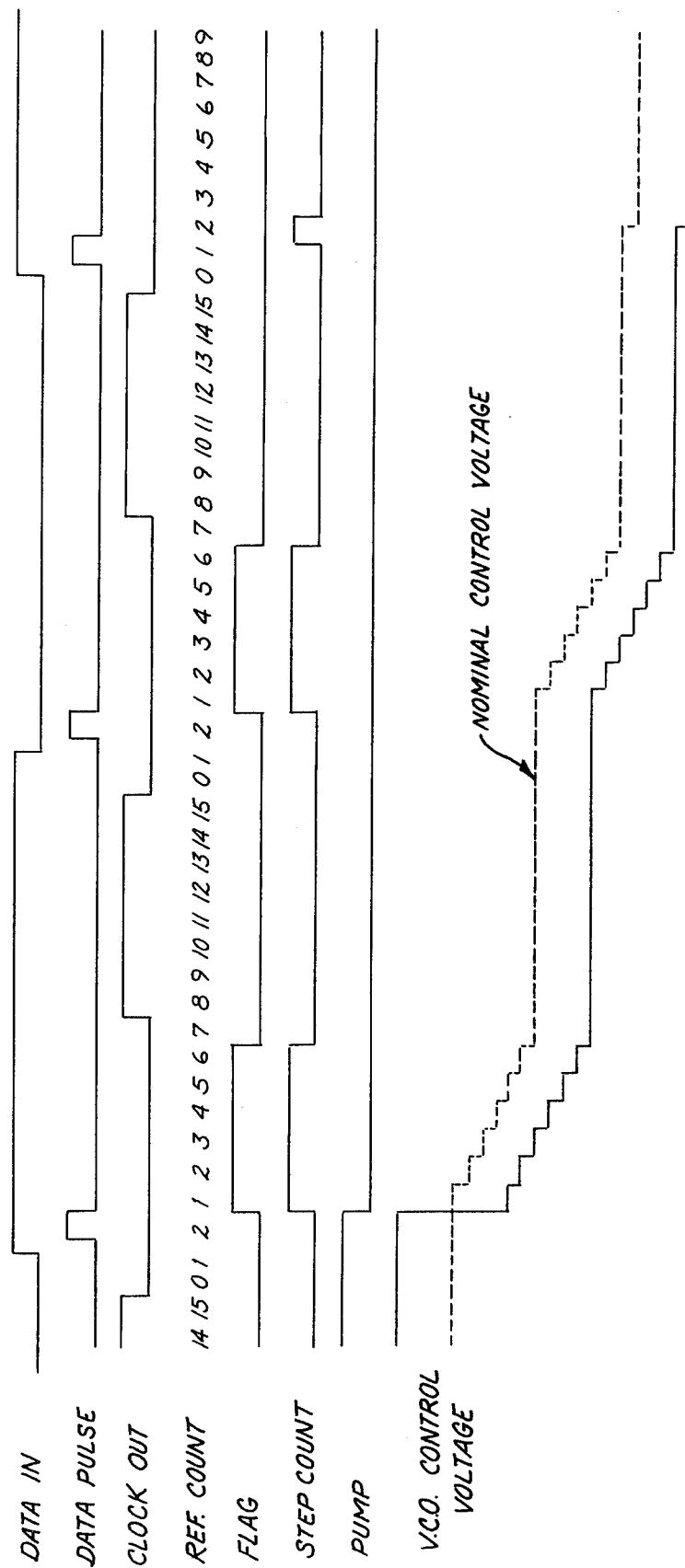

FIGS. 6 and 7 illustrate the manner of accelerated synchronization. In FIG. 6, the data leads the reference clock by more than 6.25%. Specifically, the data in FIG. 6 is leading the clock signal so that the data pulse 90 generated by transition detector 10 is in count "15" of the reference count within register 58. PROM 56, receiving data pulse 90 from transition detector 10 and the count from register 58 senses the coincidence of data pulse 90 in count "15" and causes register 58 to set a flag signal 92 on lead 94 (FIG. 2). The flag signal from PROM 56 also forces the counter portion of register 58 to a count of "2" (regardless of the previous count) and forces the pump up signal to a set or high condition. In addition, PROM 56 sets step count signal 96 to a high condition for six cycles of the VCO clock signal. With the pump up signal high and the pump control signal 96 high for a period of six counts, the count in counter 30 is advanced by six thereby increasing the control voltage signal 98 to VCO 14. As shown in FIG. 6, the control voltage is increased with each VCO clock cycle during the six counts that step count signal 96 is high. When, as shown in FIG. 6, the clock is within 6.25% of the data, the operation will revert to its normal operation hereinabove described. Thus, data pulse 100 is located in the "0" count, indicating the data still leads the clock, but by less than 6.25%, thereby causing an advance of only one step (0.5%) in the frequency of VCO 14.

Similary, as shown in FIG. 7, if the data lags the clock by more than 6.25% (e.g., the data pulse is in reference count "2"), PROM 56 sets the flag and step count signals as heretofore described and sets the pump up signal to a low condition (indicating a pump down condition), thereby causing a decrement of the count in counter 30 by a count of six and a corresponding decrease in the control voltage to VCO 14. Also, PROM 56 forces the count in register 58 to a count of "1" (regardless of the previous count). Again, when the data pulse from transition detector 10 is again in the "1" count (indicating synchronism to within 6.25%), the system reverts to its normal operation hereinbefore described.

As heretofore described, it is preferred that the phase digital-to-analog converter 36 provide an adjustment which is about 2.5 times the correction provided by the frequency digital-to-analog converter 34. Therefore, during normal operations, a single step of the frequency counter 30 will cause a 0.5% change in frequency of VCO 14 and a corresponding 1.25% change in phase is generated by phase DAC 36. During accelerated synchronization of the reference clock, a frequency shift of 3.0% is caused by a step of six counts as described in connection with FIGS. 6 and 7, and a phase shift of 7.5% is generated (6.25% shift caused by advancing or retarding the count in register 58 and 1.25% caused by DAC 36). Thus, stability is maintained by maintaining the PFR at 2.5.

It will be appreciated that the accelerated frequency synchronization achieves synchronization in less time than without the accelerated feature. Thus, without the accelerated feature, a frequency difference of 32% would require 64 data cells to achieve synchronization, whereas with the acceleration feature only 21 cells, or data transitions are required for frequency synchronization: 9 cells at 3% correction per cell and 12 cells at 0.5% correction. Once synchronization is achieved, the capture signal is removed for normal operation.

The algorithm within PROM 56 may be summarized, for the accelerated (capture) function, as follows:

TABLE 1—Data Acquisition Algorithm

A. If the data pulse from transition detector 10 occurs during reference count "0",
 1. Set pump up signal high, and
 2. Set step count signal for one VCO clock cycle if pump up signal was already high from previous data pulse.
B. If the data pulse from transition detector 10 occurs during reference count "1",
 1. Reset pump up signal low, and
 2. Set step count signal for one VCO clock cycle if pump up signal was already low from previous data pulse.
C. If the data pulse from transition detector 10 occurs during reference counts "2" through "8",
 1. Reset pump up signal low,
 2. Set flag signal for six VCO clock cycles,
 3. Force count in register 58 to "1", and
 4. Step count signal for duration of flag signal.
D. If the data pulse from transition detector 10 occurs during reference counts "9" through "15",
 1. Set pump up signal high,
 2. Set flag signal for six VCO clock cycles,
 3. Force count in register 58 to "2", and
 4. Set step count signal for duration of flag signal.

The description thus far has been concerned with data not containing peak shift. Data recorded on magnetic tape contains a certain amount of peak shift, the amount being a function of the encoding technique and method of recording. For example, peak shift may be quite severe in group code recording (GCR). Peak shift normally occurs on data transitions that surround zero data cells. Low amplitude data due to a temporary drop out can generate peak shift on all transitions. Up stream and down stream shift, caused by the data pattern changing between a high frequency pattern (ones) and a low frequency pattern (zeros) can affect peak shift. The present invention provides for peak shift correction through the use of special algorithms in PROM 56. For data recovery in magnetic tape, I prefer to divide the pump up and pump down boundaries into five zones (instead of two heretofore described): For the pump down boundary, the five zones are (1) count "1" (indicating less than 6.25% phase shift, (2) counts "2" and "3" (indicating a phase shift between 6.25% and 18.75%), (3) counts "4" and "5" (indicating a phase shift between 18.75% and 31.25%), (4) counts "6" and "7" (indicating a phase shift between 31.25% and 43.75%), and (5) count "8" indicating a phase shift between 43.75% and 50%). Similarly the five zones of the pump up boundary are (1) count "0", (2) "counts "14" and "15", (3) counts "12" and "13", (4) counts "10" and "11", and (5) count "9". It is desired, for the first zone (counts "0" or "1") the decision to make a correction is based on the conditions of the previous cycle as heretofore described. For the second zone (counts "2", "3", "14" or "15") it is desired to phase shift by 6.25% if the flag signal is not set. For the third zone (counts "4", "5", "12" and "13") a phase shift of 6.25% is desired, whereas during the fourth and fifth zones (counts "6" through "11") a phase shift of 12.5% is desired. In addition, for the fifth zone (counts "8" and "9") an error signal should be generated to alert external equipment of a peak shift error approaching 50%. In addition, a frequency shift of 0.5% is desired for phase shift accomplished. FIGS. 8A–8E and 9A–9E illustrate the operation of the apparatus.

Whenever PROM 56 detects a data pulse from transition detector 10 within any of counts "4" through "13" (indicating a phase shift greater than 18.75%) the PROM causes the flag signal to be set. The flag signal remains set until cleared as hereinafter explained. In addition, if the data pulse occurs in counts "12" or "13", PROM 56 causes the count within register 58 to advance by one additional count (FIG. 8D), whereas if the data pulse occurs in counts "4" or "5", PROM 56 causes the count with register 58 to retard by one count (actually, to hold its count for one VCO clock cycle), as shown in FIG. 9D. Likewise, if the data pulse occurs in counts "6" through "8" or "9" through "11", the count in register 58 is advanced or retarded by two counts (FIGS. 8E and 9E). Also, if the data pulse occurs in either count "8" or "9", PROM 56 causes register 58 to place a phase error signal on output lead 20 (FIGS. 1 and 2). The phase error signal is employed to alert the system that peak shift error is between 43.75% and 50%.

If the data pulse is within counts "2", "3", "14" or "15", PROM 56 advances or retards the count in register 58 by one count only if the flag signal is not set. If the flag was set (e.g., from a previous cell wherein the data pulse occurred within counts "4" through "13"), the count within register 58 is advanced or retarded only if the direction of the data pulse is the same as the previous cell. If the direction is opposite that of the previous cell, the count in register 58 is incremented as in normal operation. This is illustrated in FIGS. 8B, 8C, 9B and 9C wherein the count is advanced by one count for pump up conditions and retarded for one count for pump down conditions if the flag is not set. Also, PROM 56 resets the flag signal in zone 1 and 2 conditions if the pump up or pump down condition is opposite that of the previous cell. Therefore, if the flag is set during a severe pump up condition (e.g. counts "9" through "13"), and a pump up condition is sensed in counts "14" or "15", the flag is not reset. The flag signal will be reset only when a reversal of the pump up or pump down condition is sensed. If the flag is set and a reversal condition is sensed, a data pulse in count "2", "3", "14" or "15" will not advance or retard the count in register 58. See particularly FIGS. 8C and 9C, and particularly the left-hand data pulse thereof.

If the data pulse occurs in cells "0" or "1", only the incrementing of the count in register 58 will occur. If the flag was previously set, it will be reset if the pump up or pump down condition is opposite that of the previous cycle.

As will be appreciated by inspection of FIGS. 8 and 9, each addition or subtraction of the count in register 58 serves to alter the phase of the output clock signal by 6.25%.

During each correction cycle, a single step count signal is generated to step the count in counter 30 by one count, in accordance with the condition of the pump up signal. However, unlike the conditions given in respect to FIGS. 6 and 7, only a single step to the frequency counter is achieved. Therefore, a phase correction of up to 13.75% is achievable with only a 0.5% frequency shift. Hence, a frequency shift of 0.5% will employ a corresponding 1.25% phase shift by converter 36 (using PFR=2.5) plus up to 12.5% phase shift by phase detector 16. The algorithm for data recovery for magnetic tape is summarized in Table II.

TABLE II—Data Recovery Algorithm For Magnetic Tape

A. If the data pulse from transition detector 10 occurs during reference counts "6" through "11",
  1. Set pump up signal to proper direction (low for "6" through "8" and high for "9" through "11"),
  2. Set flag signal,
  3. Generate a 12.5% phase correction by adding 2 counts to register 58 for "9" through "11" or subtracting 2 counts from register 58 for "6" through "8",
  4. Set step count signal for one VCO clock, and
  5. Set phase error signal for "8" or "9".
B. If data pulse from transition detector 10 occurs during reference counts "4", "5", "12" or "13",
  1. Set pump up signal to proper directions,
  2. Set flag signal,
  3. Generate a 6.25% phase correction by adding 1 count to register 58 for "12" or "13" or subtracting 1 count from register 58 for "4" or "5", and
  4. Set step count signal for one VCO clock.
C. If data pulse from transition detector 10 occurs during reference count "2", "3", "14" or "15",
  1. Set pump up signal to proper direction,
  2. Generate a 6.25% phase correction by adding or subtracting one count in register 58 if either (a) the flag is not set, or (b) the flag is set and the pump up or pump down condition is the same as the previous data transition.
  3. Set step count signal for one VCO clock if pump up or pump down condition is same as that of the previous data transition, and
  4. Reset flag signal if pump up or pump down condition is opposite that of the previous data transition.
D. If data pulse from transition detector 10 occurs during reference counts "0" or "1",
  1. Set pump up signal to proper direction,
  2. Set step count signal for one VCO clock if pump up or pump down condition is same as that of the previous data transition, and
  3. Reset flag signal if pump up or pump down condition is opposite that of the previous data transition.

One feature of the present invention resides in the fact that the recovery system may be utilized to recover multiple data rate frequencies without the use of separate filters as may be required in analog phase-lock loop circuits. Thus, the VCO clock signal is divided to derive the output clock, without disturbing the stability of the system. Phase and frequency corrections are based on percentage of the data cell. Dividing the VCO clock lowers the reference clock to some multiple of the VCO clock signal without affecting the percentage correction.

As herein described, phase DAC 36 is a ternary device which provides a ±1.25% phase shift. In reality, DAC 36 may be an 8-bit DAC, using only two bit positions. If desired, other bit positions of DAC 36 may be used to achieve multiples of 1.25% phase correction. For example, if five of the bit positions of DAC 36 were used, DAC 36 could be used to achieve any multiple of 1.25% phase shift, up to 18.75%. Therefore, DAC 36 could be employed to generate desired 6.25% and 12.5% phase shifts. However, to employ DAC 36 to operate additional bit positions, register 58 of phase detector 16 would need to be correspondingly enlarged with a separate register output driving each additional bit position input of DAC 36. Also, additional programming in PROM 56 will be required to accomplish phase correction in DAC 36 instead of in register 58.

The clock recovery system is a general purpose clock recovery system which can be used to recover clock signals from any input data stream. The recovery algorithm stored in the PROM of the phase detector may be refined for different input data streams. The clock recovery system according to the present invention, being a digital system in its frequency selection, does not exhibit the instability, drift and temperature problems associated with analog phase-lock loop circuits. Instead, clock frequency is controlled by the contents of frequency counter 30. If data drops out, frequency will not drift or change. Nor does the recovery system require high frequency oscillators to obtain accurate frequency synchronization. Instead, the voltage controlled oscillators operated in conjunction with the frequency counter provide 0.25% frequency accuracy with only an 8-bit frequency counter and still achieve a frequency range of ±32 percent.

The present invention thus provides a clock recovery system which is effective in operation, inexpensive to manufacture and operate and is more stable than previous systems, achieving synchronization with a minimum of jitter, improved lock range, and minimum access time.

This invention is not to be limited by the embodiment shown in the drawings and described in the description, which is given by way of example and not of limitation, but only in accordance with the scope of the appended claims.

What is claimed is:

1. A clock recovery system for generating an output clock signal locked to the phase and frequency of an input data rate, said input data rate comprising a sequence of encoded data signals, said system comprising, in combination: data detector means for detecting said data signals; oscillator means responsive to an analog signal for generating a first clock signal having a frequency of oscillation representative of the value of said analog signal; phase detector means comprising memory means and register means, said register means being responsive to said first clock signal for cyclicly counting the oscillations of said first clock signal to generate said output clock signal, and said memory means being responsive to the count in said register means and to the output of said data detector means for determining the relative phase relationship between each said data signal and said output clock signal and for storing information pertaining to said relative phase relationship; counter means for containing a count; converter means responsive to the count in said counter means for generating said analog signal; said memory means being responsive to the relative phase relationship of a data signal and to the stored information pertaining to a previous relative phase relationship to operate said counter means to selectively increment or decrement the count therein to thereby alter the frequency of said first clock signal.

2. Apparatus according to claim 1 wherein said memory means is responsive to a relative phase relationship exceeding a predetermined amount to operate said counter means to selectively increment or decrement the count therein to thereby alter the frequency of said first clock signal.

3. Apparatus according to claim 1 wherein said memory means is responsive to a relative phase relationship exceeding a predetermined amount to operate said register means to selectively advance or retard the count therein to thereby alter the phase of said output clock signal.

4. Apparatus according to claim 3 wherein said register means is a sixteen count register providing one full output clock cycle for each sixteen first clock cycles, said memory means being operable to selectively increment or decrement the count in said register means by one count if the memory means detects a phase relationship greater than 6.25% and to selectively increment or decrement the count in said register means by two counts if the memory means detects a phase relationship greater than 31.25%.

5. Apparatus according to claim 4 wherein said memory means sets a flag signal whenever it detects a relative phase relationship greater than 18.75% and resets the flag signal whenever it detects a relative phase relationship less than 18.75% in a direction opposite that of the stored information pertaining to the previous relative phase relationship, the count in said register means being selectively advanced or retarded when said memory detects a phase relationship between 6.25% and 18.75% only if said flag signal is not set.

6. A clock recovery system for generating an output clock signal locked to the phase and frequency of an input data rate, said input data rate comprising a sequence of encoded data signals, said system comprising, in combination: data detector means for detecting said data signals; oscillator means responsive to an analog signal for generating a first clock signal having a frequency of oscillation representative of the value of said analog signal; phase detector means comprising memory means and register means, said register means being responsive to said first clock signal for cyclicly counting the oscillations of said first clock signal to generate said output clock signal, and said memory means being responsive to the count in said register means and to the output of said data detector means for determining the relative phase relationship between each said data signal and said output clock signal; counter means for containing a count; converter means responsive to the count in said counter means for generating said analog signal; said memory means being responsive to a relative phase relationship exceeding a predetermined amount to operate said counter means to selectively increment or decrement the count therein to thereby alter the phase of said first clock signal.

7. Apparatus according to any of the previous claims further including second converter means responsive to outputs of said phase detector means for generating a second analog signal representative of a phase shift to be accomplished on said data signals, means for adding said first-named analog signal and said second analog signal to operate said oscillator means.

* * * * *